US006418000B1

(12) United States Patent
Gibbons et al.

(10) Patent No.: US 6,418,000 B1
(45) Date of Patent: Jul. 9, 2002

(54) DUAL, SYNTHETIC SPIN VALVE SENSOR USING CURRENT PINNING

(75) Inventors: Matthew R. Gibbons, Livermore; Marcos Lederman, San Francisco, both of CA (US)

(73) Assignee: Read-Rite Corporation, Milpitas, CA (US)

( * ) Notice: Subject to any disclaimer, the term of this patent is extended or adjusted under 35 U.S.C. 154(b) by 0 days.

(21) Appl. No.: 09/235,098

(22) Filed: Jan. 21, 1999

(51) Int. Cl.[7] .............................................. G11B 5/127
(52) U.S. Cl. ................................................... 360/324.11
(58) Field of Search ............................... 360/313, 324.1, 360/324.11, 324.12, 121, 126, 125

(56) References Cited

U.S. PATENT DOCUMENTS

| | | | |
|---|---|---|---|
| 5,206,590 A | 4/1993 | Dieny et al. ................. | 324/252 |
| 5,287,238 A | 2/1994 | Baumgart et al. ........... | 360/113 |
| 5,465,185 A | 11/1995 | Heim et al. .................. | 360/113 |
| 6,074,743 A | * 6/2000 | Araki et al. ................. | 360/126 |
| 6,175,476 B1 | * 1/2001 | Huai et al. .............. | 360/324.11 |
| 6,181,533 B1 | * 1/2001 | Pokhil .................... | 360/324.11 |
| 6,181,534 B1 | * 1/2001 | Gill ........................ | 360/324.11 |

OTHER PUBLICATIONS

Dieny, B. et al. "Giant Magnetoresistance in Soft Ferromagnetic Multilayers", Physical Review B, vol. 43, No. 1, Jan. 1, 1991, pp. 1297–1300.

* cited by examiner

Primary Examiner—Allen Cao
(74) Attorney, Agent, or Firm—Mikio Ishimaru

(57) ABSTRACT

A dual symmetric spin valve sensor consists of outer ferromagnetic pinned layers which are pinned by a current induced magnetic field. One of the outer pinned layers is magnetically coupled to an inner pinned layer which is pinned so that the magnetization of the other outer and the inner pinned layers are in the same direction. This provides the magnetization for the free layer disposed between the two layers to properly use the spin valve effect. The ferromagnetic layers are separated by conductor layers. The pin layers are synthetic antiferromagnetic layers consisting of the two layers tightly interlayer exchange coupled. The field induced by the sense current pins the pinned layers.

21 Claims, 3 Drawing Sheets

DUAL, SYNTHETIC SPIN VALVE SENSOR USING CURRENT PINNING

TECHNICAL FIELD

The present invention relates generally to magnetic sensors for reading information signals recorded in a magnetic medium and, more particularly, to a magnetoresistive read sensor based on the spin valve effect, and most particularly, to such a sensor which utilizes improved pinning in a dual spin valve configuration.

BACKGROUND ART

A large portion of the data storage in today's computers is done on magnetic media such as magnetic disks. Data is presented to a computer by huge quantities of bits (ones and zeroes) and stored on disks where each bit is represented by a transition which causes an applied magnetic field. In order to read the value of any given bit, a sensor able to detect changes in the applied magnetic field is required.

To this end, a sensor that changes electrical resistance in response to a magnetic field, called a magnetoresistive (MR) sensor, is employed. Most sensors utilize the anisotropic magnetoresistive (AMR) effect where a read element resistance varies in proportion to the square of the cosine of the angle between the magnetization in the read element and the direction of a sense current flowing through the read element. Data is read by the sensor from magnetic transitions recorded in the media. The magnetic field, resulting from a transition, causes a change in the direction of the magnetization in the read element. The new magnetization direction changes the resistance of the read element with a corresponding change in the sense current or voltage.

Newer sensors, which are more sensitive to smaller recorded transitions on higher density media, are starting to become more commonly used. These sensors use a larger form of magnetoresistance called the giant magnetoresistance (GMR) effect. The GMR effect produces a magnetoresistance that, for selected combinations of materials is greater in magnitude than that of the AMR effect. The GMR effect occurs in multilayer thin films of alternating ferromagnetic and nonferromagnetic metals. The resistance of a GMR film changes according to the cosine of the angle between the magnetization of the ferromagnetic (FM) layers.

A subset of the GMR devices is the spin valve in which two ferromagnetic layers, a "free" layer and a "pinned" layer, are used as explained in B. Dieny, et al. "Giant Magnetoresistance in Soft Ferromagnetic Multilayers", Physical Review B, Vol. 43, No. 1, Jan. 1, 1991, pp. 1297–1300 and Dieny, et al. U.S. Pat. No. 5,206,590. When the magnetization in the two layers are aligned, the resistance is at a minimum. When the magnetization are anti-aligned, the resistance is at a maximum. The resistance varies as the cosine of the angle between the magnetizations and is independent of the direction of current flow. The magnetization of the pinned layer is held in place by depositing it next to a layer of antiferromagnetic (AFM) material with a resulting exchange coupling of the two layers. The free layer magnetization is free to rotate in response to the field from the disk. In this way, the magnetization swings between being parallel (low resistance state) to anti-parallel (high resistance state) as the head flies over recorded magnetic transitions on the disk. The resulting change in electrical resistance arising from the GMR effect is sensed and the magnetic information on the disk is transformed into electrical signals. Commonly used metallic AFM materials are platinum manganese (PtMn), iron manganese (FeMn), nickel manganese (NiMn), iridium manganese (IrMn), and nickel oxide (NiO).

In the past, GMR sensors using the spin valve effect had many problems. Some problems are directly related to the presence of the AFM material present in the pinned layers of the spin valve sensor. For example, when heated above a material dependent temperature (the blocking temperature), as occurs during surges in current flow through the sensor or a momentary contact of the read element with the media, the AFM material loses the ability to pin, or depins, the pinned layers. When the pinned layers lose their fixed orientation, the spin valve effect ceases to operate, and the sensor no longer functions. The same problem sometimes occurs because the AFM material has a tendency to corrode during manufacturing.

Additional problems occur because the magnetostatic field from the pinned layers tends to bias the free layer in an undesirable way, making readings from the sensor unreliable. It has also been found that the AFM material requires a buffer layer to maximize exchange coupling. However, the buffer layer and the AFM layer tend to shunt current which decreases the resistance and therefore the response of the device.

Thus, there have been many problems and solutions have been long sought. However, a solution has long eluded those skilled in the art.

DISCLOSURE OF THE INVENTION

The present invention provides a symmetric, or dual, spin valve sensor consisting of outer ferromagnetic pinned layers which are pinned by a current induced magnetic field. One of the outer pinned layers is a synthetic anti-ferromagnet consisting of two ferromagnetic layers separated by a thin space layer. The spacer thickness is set so the ferromagnetic layers are tightly anti-ferromagnetically exchange coupled; i.e. the magnetization of the layers are held in opposite directions. The free layer is separated from the pinned layers by conducting spacer layers. The current is centered on the free layer which minimizes the effect of the current induced field on the free layer.

The present invention further provides simplicity of design for a dual spin valve sensor.

The present invention further provides a reliable spin valve which is not subject to thermal asperities.

The present invention further provides a spin valve MR sensor in which the free layer is not subject to current induced magnetic fields.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
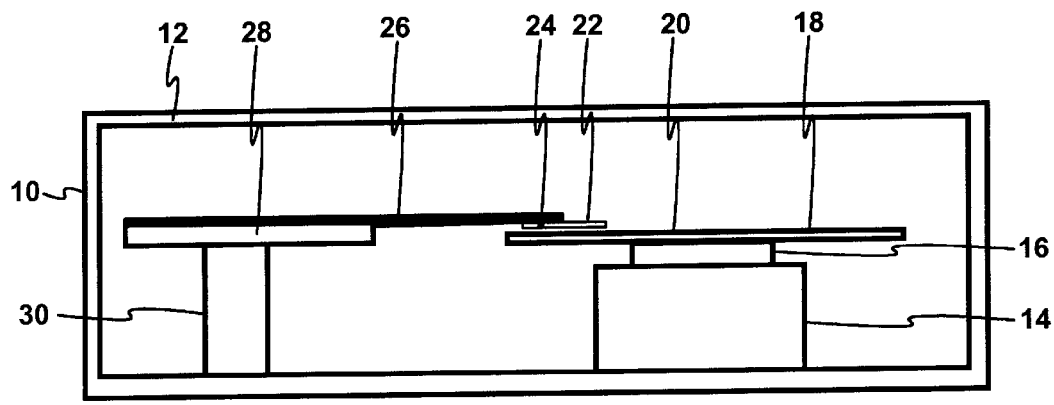
FIG. 1 (PRIOR ART) is a side view schematic of a disk drive system using the present invention.

Referring now to FIG. 1 (PRIOR ART), therein is shown a magnetic recording disk drive system 10. The system 10 has a housing 12 on which a disk drive motor 14 is mounted.

The disk drive motor 14 is a high-speed motor having a hub 16 on which one or more magnetic recording disks, such as the magnetic recording disk 20, is mounted.

The magnetic recording disk 20 is generally covered by a lubricant to minimize friction during start-up conditions. During operation, a film of air on the rotating disk 20 lifts an air-bearing slider 22 away from the surface of the disk 20. A read/write transducer 24 is mounted to the air-bearing slider 22.

The read/write transducer 24 has the giant magnetoresistive (GMR) or spin valve sensor of the present invention incorporated in it.

The air-bearing slider 22 and the read/write transducer 24 are held by a suspension arm 26 which provides a spring action to hold the air-bearing slider 22 within a specified range of distances from the surface of the disk 20. The suspension arm 26 is supported by an arm 28 which is rotated by an actuator 30. As the disk drive motor 14 rotates the disk 20, the actuator 30 moves the read/write transducer 24 radially with respect to the surface of the disk 20 to access different data tracks thereon.

Figure 2:
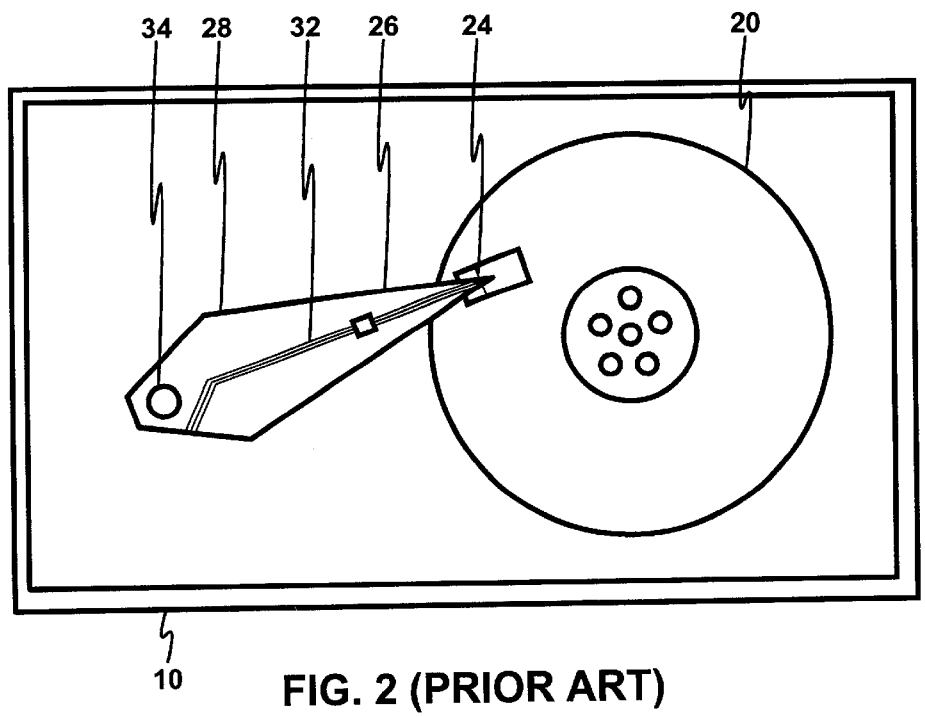
FIG. 2 (PRIOR ART) is a simplified top view of the system incorporating the present invention.

Referring now to FIG. 2 (PRIOR ART), therein is shown the top view of the system 10 with the transducer 24 at the end of the suspension 26 and connected by wires 32 to read/write circuitry (not shown). A pivot 34 allows the arm 28 to turn in order to read/write to various tracks on the disk 20.

Figure 3:
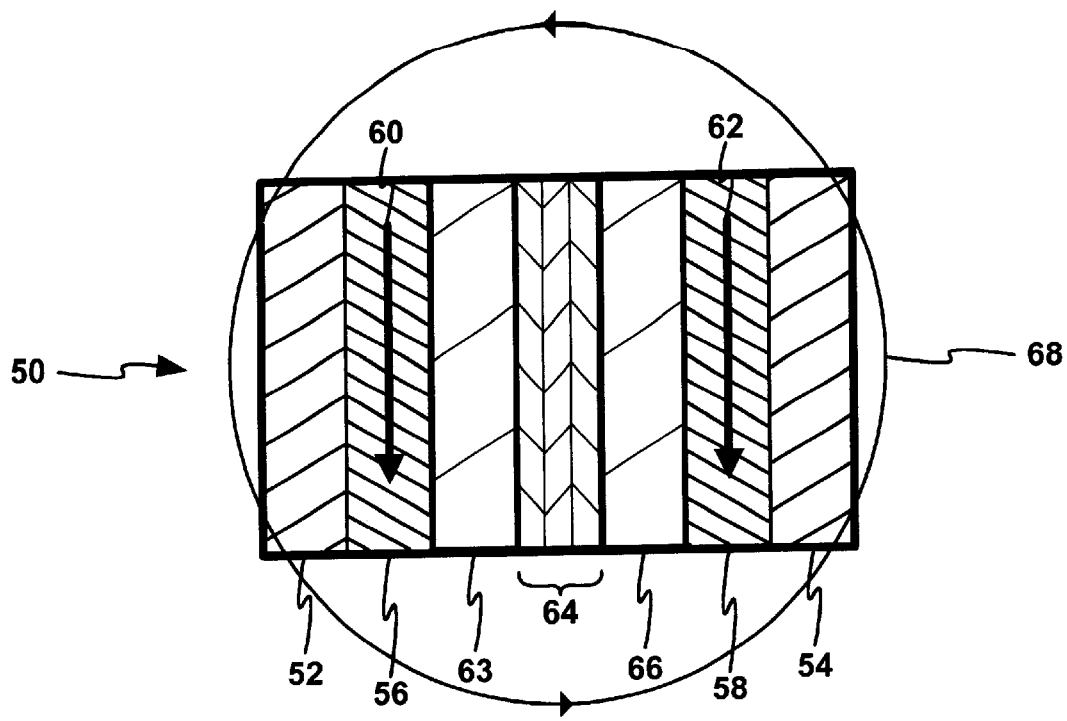
FIG. 3 (PRIOR ART) is a cross-sectional view of the various layers in a prior art giant magnetoresistive sensor.

Referring now to FIG. 3 (PRIOR ART), therein is shown a cross-section of a dual spin valve 50 such as shown in the U.S. Pat. No. 5,287,238 to Baumgart, et al. titled "Dual Spin Valve Magnetoresistive Sensor". The spin valve 50 has two outer layers of antiferromagnetic material, or AFM layers 52 and 54. Inside the AFM layers 52 and 54 are first and second pinned layers 56 and 58, respectively, with the magnetization of both being shown as downward by the arrows 60 and 62, respectively. Between the pin layers 56 and 58 is a free layer 64 which has its magnetization being perpendicular to the magnetization indicated by the arrows 60 and 62, and therefore perpendicular to the plane of FIG. 3 (PRIOR ART). Disposed around the free layer 64 are conducting spacers 63 and 66. A current induced magnetic field 68 is shown with the direction of magnetization shown by the arrowheads.

Figure 4:
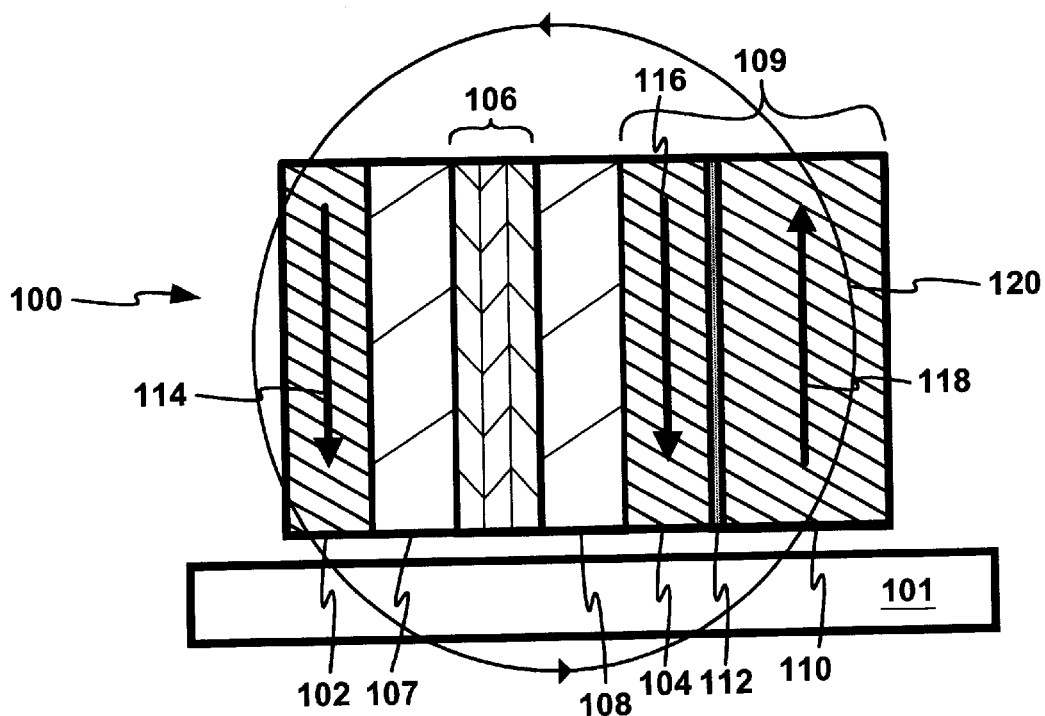
FIG. 4 is a cross-sectional view of the layers of the giant magnetoresistive sensor of the present invention.

Referring now to FIG. 4, therein is shown a giant magnetoresistive sensor 100 using current pinning in accordance with the present invention. The disk 101 (not to relative size) is disposed at the bottom of FIG. 4. The spin valve 100 has pinned layers 102, 104, and 110. Between the pinned layers 102 and 104 is a free layer 106. The free layer 106 is a laminate of nickel-iron (NiFe) between layers of cobalt (Co), cobalt-iron (CoFe), or any magnetic soft alloy of cobalt. The free layer 106 has conductors 107 and 108 on either side. Away from the free layer 106 on the other side of the pinned layer 104 is an outer pinned layer 110. The magnetization of the pinned layers 102 and 104 is downward as shown by the arrows 114 and 116. The magnetization of the pinned layer 110 is opposite from the arrows 114 and 116 as shown by the arrow 118. The pinned layers 104 and 110 along with a coupling layer 112 form a synthetic pinned layer 109. The coupling layer 112 is generally of ruthenium (Ru). A current induced magnetic field 120 is shown with the direction of the field shown by the arrowheads.

Figure 5:
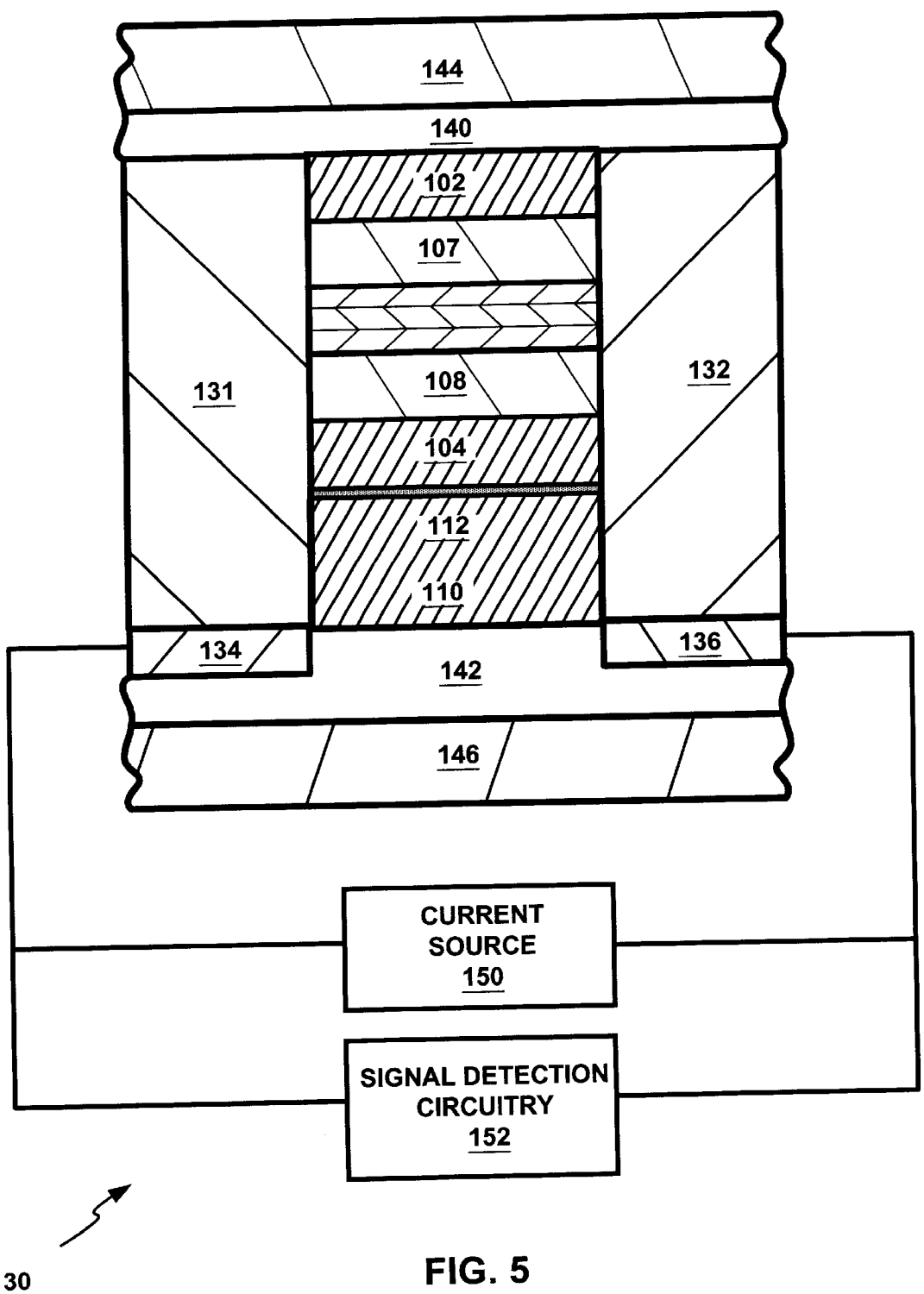
FIG. 5 is the spin valve system of the present invention.

Referring now to FIG. 5, therein is shown the sensor system 130 with the same is elements as in FIG. 4 having the same numbers as in FIG. 5. FIG. 5 shows a view looking up from the disk 101. On the sides of the giant magnetoresistive sensor 100 are permanent magnet bias layers 131 and 132, which are used for stabilization of the motion of the free layer 106 and are of a cobalt-chromium-platinum alloy or other similar hard magnetic materials. The permanent magnet bias layers 131 and 132 have gold conductors 134 and 136 deposited as contacts. The aforementioned assembly is surrounded by insulators 140 and 142 and sandwiched between magnetic shields 144 and 146.

The gold conductors are connected to a current source 150 across which is disposed signal detection circuitry 152 which detects the changes in the voltage through all of the metal layers of the giant magnetoresistive sensor 100 from one contact to the other across the giant magnetoresistive sensor 100.

In operation in the past, when the magnetization of the free layer 64 is exactly the opposite of the magnetization of the pinned layers 56 and 58, the resistance of the free layer 64 will be at a maximum due to the spin valve effect. As the applied magnetic fields from the transitions in the magnetic media cause the magnetization of the free layer 64 to rotate perpendicular to the magnetization of the pinned layers 56 and 58, the resistance will reach its half-way point, and when the magnetization of the free layer 64 is the same as the magnetization of the pinned layers 56 and 58, the resistance will be at a minimum. The spin valve 100 is designed so the magnetization is the same in the pinned layers 56 and 58 and the magnetization of the free layer 64 is at 90° when the applied magnetic field is zero.

As a bit goes by in the data stream, the magnetization of the free layer 64 will shift back and forth across the position where the magnetization is perpendicular to the magnetization of the pinned layers 56 and 58 as the magnetic level of the disk 20 first increases and then decreases. The resistance variation has the form:

$$\Delta R(\Theta) = \left(\frac{\Delta R}{R}\right) R_S \frac{TW}{SH} (1 - \cos\Theta)/2$$

where: $R_S$ = sheet resistance
$TW$ = track width
$SH$ = stack height

From the above, it is seen that in spin valve devices, the resistance response is centered in its range when theta (↓) is 90 degrees, perpendicular to the arrows 60 and 62, for a zero applied field. The dual spin valve normally achieves the proper quiescent state by pinning the pinned layers 56 and 58 using the antiferromagnetic layers 52 and 54. The antiferromagnetic layers 52 and 54 contain atoms where the magnetic moment of the atoms reverses from atom to atom, while for ferromagnetic materials they are all in the same direction.

The antiferromagnetic layers 52 and 54 are annealed in the transverse direction parallel to the stripe height direction. The transverse direction parallel to the stripe height direction is the direction of the arrows 60 and 62. The optimum symmetric response of the magnetization of the free layer 64 is achieved when the free layer magnetization is in the longitudinal direction (parallel to the track width) of the disk 20 when the applied field is zero. Unfortunately, the magnetostatic field from the pinned layers 56 and 58 tend to bias the free layer 64 in the direction opposite to the direction of the pinned layers.

One of the problems with the antiferromagnetic layers 52 and 54 is that they are made of such materials as iridium manganese (IrMn), which have reliability and manufacturing problems such as high corrosion potential and the need for annealing to set the pinning direction. Both problems accelerate depinnings. Further, the performance of the read/write transducer 24 can change if there are large transient currents or high temperature variations. Since there is high current flow through the conductors 65 and 66, these high temperatures occur often.

In addition, it has been found that optimum performance of the pinned layer 58 is only achieved when a buffer layer of material (not shown), such as nickel-iron (NiFe), followed by copper (Cu) is deposited first. This buffer layer can affect the magnetic performance of the spin valve 50. Since it is offset from the center of the current distribution, it can be biased similar to a soft adjacent layer (SAL) in an AMR effect sensor. It can be oriented to partially offset the magnetostatic fields of the pinned layers 56 and 58.

Further, the current induced magnetic field 68 is in the direction of the magnetization 60 of the pinned layer 56 while opposite to the direction of the magnetization 62 of the pinned layer 58. This effect tends to depin the pinned layer 58.

In operation with the present invention, the current induced magnetic field 120 is used to pin the pinned layers 102 and 110 in the directions indicated by the arrows 114 and 118.

To bias the magnetization 116 in the pinned layer 104, the pinned layer 110 and the pinned layer 104 are separated by a thin layer of a Group VIII material such as ruthenium (Ru), forming a synthetic pinned layer 109. The synthetic pinned layer 109 has a strong, antiferromagnetic coupling between the pinned layers 110 and 104 to pin the magnetization in the pinned layer 104 in the direction shown by the arrow 116 while the current induced magnetic field 120 pins the pinned layers 102 and 110.

The current induced magnetic field 120 is almost zero at the free layer 110 because the current is almost centered on the free layer 110. Thus, changes in bias current will not affect the bias point. With a stationary bias point, changes in the detected signal track average amplitude (TAA) or changes in TAA asymmetry will not occur with changes in current.

The application of an external magnetic field from magnetic media causes a variation in the relative orientation of neighboring ferromagnetic layers. This, in turn, causes a change in the spin-dependent scattering of conduction electrons and thus the electrical resistance of the structure.

Thus, a spin valve is created which does not require antiferromagnetic layers and in which the current induced magnetic field is used to actually pin the magnetization and does not affect the free layer.

In the best mode, the layer structure of the spin valve 100 is:

CoFe t1/Cu tc/Free tf/Cu tc/CoFe t2/Ru tr/CoFe t3

Thicknesses t1, t2, and t3 of the respective pinned layers 102, 104, and 110 are set so that the pinned layers 102 and 109 each have a net magnetic moment equivalent to approximately a 20 angstrom thickness of CoFe. With a positive current out of the plane the layer magnetizations will align as indicated by arrows 114, 116, and 118. Thickness t3 is made substantially larger than t2, about twice the thickness. In this way, the net magnetic moment of the synthetic pinned layer 109 is pinned in the direction of the current induced magnetic field 120. The net magnetic moments of the two pinned layers 102 and 110 are in opposite directions allowing their magnetostatic coupling to enhance the pinning strength. The current induced magnetic field 120 pins the layers 102 and 104 in such a way that the magnetization 114 and 116 are always in the same direction so the proper spin valve response will occur.

The thicknesses of the copper spacers, tc, are approximately 20 to 25 angstroms while the thickness of the free layer, tf, is between 25 to 70 angstroms.

As previously described, the current induced magnetic field 120 is almost zero at the position of the free layer 106. Thus, changes in bias current will not affect the bias point. With a stationary bias point, changes in TAA asymmetry will not occur with changes in current. The bias point of the free layer 106 is still affected by two factors: the remaining magnetostatic field from the pinned layers and the inner layer exchange coupling between the pinned and free layers. The thicknesses t1, t2, and t3 of the pinned layers 102, 104 and 110 can be adjusted to properly offset the ferromagnetic interlayer exchange coupling.

The giant magnetoresistive sensor 100 with current pinning retains the advantages of a standard dual spin valve while eliminating the complications and problems associated with antiferromagnetic pinning.

While the present invention has been described in conjunction with a specific best mode, it is to be understood that many alternatives, modifications, and variations will be apparent to those skilled in the art in light of the aforegoing description. For example, the present invention can be used in systems using tapes, floppy discs, and other magnetic media in addition to magnetic disks. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A spin valve sensor comprising:
   a conductor for causing a current induced magnetic field;
   a first pinned layer capable of having the magnetization thereof pinned in a first direction by said current induced magnetic field;
   a second pinned layer capable of having the magnetization thereof pinned in a second direction by said current induced magnetic field;
   a third pinned layer capable of having the magnetization thereof pinned in said first direction by a magnetic coupling with said second pinned layer; and
   a free layer subject to the spin valve effect disposed between said first and third pinned layers.

2. The spin valve sensor as claimed in claim 1 wherein said free layer is substantially centerable on said current induced magnetic field.

3. The spin valve sensor as claimed in claim 1 wherein said first and second pinned layers are substantially symmetrically positionable in said current induced magnetic field.

4. The spin valve sensor as claimed in claim 1 wherein said magnetization of said first and second pinned layers are in pinned opposite directions.

5. The spin valve sensor as claimed in claim 1 wherein said second and third pinned layers are separated by a layer of material.

6. The spin valve sensor as claimed in claim 1 wherein said first and second pinned layers are substantially the same thickness, and said third pinned layer is substantially thicker than said first and second pinned layers.

7. The spin valve sensor as claimed in claim 1 wherein said free layer is of a different thickness from said first, second, and third pinned layers.

8. The spin valve sensor as claimed in claim 1 wherein said material disposed between said second and third pinned layers is substantially thinner than said second and third pinned layers.

9. A spin valve sensor comprising:
- first and second conductors capable of causing a current induced magnetic field;
- a first ferromagnetic layer capable of having the magnetization thereof pinned in a first direction by said current induced magnetic field;
- a second ferromagnetic layer capable of having the magnetization thereof pinned in a second direction by said current induced magnetic field;
- a third ferromagnetic layer capable of having the magnetization thereof pinned in said first direction by magnetic coupling with said second ferromagnetic layer;
- a ferromagnetic free layer subject to the spin valve effect disposed between said first and second conductors, said first and second conductors disposed between said first and third ferromagnetic layers.

10. The spin valve sensor as claimed in claim 9 wherein said free layer is substantially centerable on said current induced magnetic field.

11. The spin valve sensor as claimed in claim 9 wherein said first and second pinned layers are substantially symmetrically position able in said current induced magnetic field.

12. The spin valve sensor as claimed in claim 9 wherein said magnetization of said first and second pinned layers are in opposite directions.

13. The spin valve sensor as claimed in claim 9 wherein said second and third pinned layers are separated by a layer of material selected from the group containing Group VIII materials.

14. The spin valve sensor as claimed in claim 9 wherein said first and second pinned layers are substantially the same thickness, and said third pinned layer is substantially thicker than said first and second pinned layers.

15. The spin valve sensor as claimed in claim 9 wherein said free layer is of a different thickness from said first, second, and third pinned layers.

16. The spin valve sensor as claimed in claim 9 wherein said material disposed between said second and third pinned layers is substantially thinner than said second and third pinned layers.

17. A spin valve sensor comprising:
- first and second copper conductors capable of causing a current induced magnetic field;
- a first ferromagnetic layer of Co—Fe capable of having the magnetization thereof pinned in a first direction by said current induced magnetic field;
- a second ferromagnetic layer of Co—Fe capable of having the magnetization thereof pinned in a second direction by said current induced magnetic field;
- a third ferromagnetic layer of Co—Fe capable of having the magnetization thereof pinned in said first direction by magnetic coupling with said second ferromagnetic layer;
- a ferromagnetic free layer of NiFe and CoFe subject to the spin valve effect disposed between said first and second conductors, said first and second conductors disposed between said first and third ferromagnetic layers.

18. The spin valve sensor as claimed in claim 17 wherein said ferromagnetic layers are selected from a group consisting of cobalt, cobalt-iron, and a magnetic soft alloy of cobalt, and wherein said second and third ferromagnetic layers are separated by a thin layer of material selected from a group consisting of ruthenium and other group VIII elements.

19. The spin valve sensor as claimed in claim 17 including a system responsive to the magnetization of said free layer to sense magnetic fields on magnetic media.

20. The spin valve sensor as claimed in claim 17 including a system for reading magnetic media disposed proximate said spin valve sensor.

21. The spin valve sensor as claimed in claim 17 including a current source connected across said spin valve sensor and signal detection circuitry connected across said current source for detecting changes in current across said spin valve sensor.

* * * * *